US011635615B2

(12) United States Patent
Yamada

(10) Patent No.: US 11,635,615 B2
(45) Date of Patent: Apr. 25, 2023

(54) ACTUATOR, OPTICAL SCANNING DEVICE, AND MANUFACTURING METHODS

(71) Applicant: Kensuke Yamada, Tokyo (JP)

(72) Inventor: Kensuke Yamada, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 670 days.

(21) Appl. No.: 16/223,658

(22) Filed: Dec. 18, 2018

(65) Prior Publication Data
US 2019/0196181 A1 Jun. 27, 2019

(30) Foreign Application Priority Data

Dec. 21, 2017 (JP) ............................ JP2017-244966
Dec. 7, 2018 (JP) ............................ JP2018-230251

(51) Int. Cl.
*G02B 26/10* (2006.01)
*G02B 26/08* (2006.01)
(Continued)

(52) U.S. Cl.
CPC .......... *G02B 26/101* (2013.01); *B81B 3/0062* (2013.01); *B81C 1/00896* (2013.01); *G02B 26/0858* (2013.01); *B81B 2201/032* (2013.01); *B81B 2201/042* (2013.01); *B81B 2203/0118* (2013.01); *B81B 2203/056* (2013.01); *B81B 2203/058* (2013.01)

(58) Field of Classification Search
CPC .. G02B 26/10; G02B 26/0858; G02B 26/101; G02B 26/105; G02B 26/0841; G02B 26/0833; G02B 26/08; G02B 26/085; G02B 26/103; H04N 1/113; B81B 7/02
See application file for complete search history.

(56) References Cited

U.S. PATENT DOCUMENTS

2012/0120470 A1* 5/2012 Kitazawa ............... F21S 41/675
                                                        359/200.1
2012/0162739 A1* 6/2012 Yamada ............... G02B 26/101
                                                        359/212.1
(Continued)

FOREIGN PATENT DOCUMENTS

| JP | 2013-186145 | 9/2013 |
|----|-------------|--------|
| JP | 2014-235298 | 12/2014 |
| JP | 2016-001325 | 1/2016 |

OTHER PUBLICATIONS

Office Action dated Aug. 10, 2021 with respect to the corresponding Japanese Patent Application No. 2018-230251.

*Primary Examiner* — Ephrem Z Mebrahtu
(74) *Attorney, Agent, or Firm* — IPUSA, PLLC

(57) ABSTRACT

An actuator includes a first driving beam that is connected to an object to be driven and includes multiple first beams extending in a direction orthogonal to a first predetermined axis, ends of each adjacent pair of the first beams being connected to each other via one of first turnaround parts such that the first driving beam forms a zig-zag bellows structure as a whole; first driving sources formed on first surfaces of the first beams; and ribs formed on second surfaces of the first beams at positions that are closer to the first predetermined axis than the first turnaround parts. The first driving sources are configured to move the first driving beam and thereby rotate the object around the first predetermined axis.

26 Claims, 11 Drawing Sheets

(51) Int. Cl.
 *B81C 1/00* (2006.01)
 *B81B 3/00* (2006.01)

(56) References Cited

U.S. PATENT DOCUMENTS

| | | | | |
|---|---|---|---|---|
| 2013/0083382 | A1* | 4/2013 | Sekine | H10N 30/875 |
| | | | | 310/365 |
| 2014/0104687 | A1* | 4/2014 | Warashina | G01B 9/02056 |
| | | | | 216/2 |
| 2014/0355091 | A1* | 12/2014 | Mizutani | G02B 26/0858 |
| | | | | 359/212.1 |
| 2014/0368896 | A1* | 12/2014 | Nakazono | G02B 26/105 |
| | | | | 359/198.1 |
| 2015/0116803 | A1 | 4/2015 | Horie et al. | |
| 2015/0277107 | A1* | 10/2015 | Aimono | G02B 26/0858 |
| | | | | 359/198.1 |
| 2015/0338644 | A1* | 11/2015 | Yasuda | G02B 26/0858 |
| | | | | 359/872 |
| 2016/0116733 | A1* | 4/2016 | Yamada | G02B 26/105 |
| | | | | 359/213.1 |
| 2016/0341956 | A1* | 11/2016 | Yasuda | G02B 26/105 |
| 2021/0191106 | A1* | 6/2021 | Sugimoto | G02B 26/0841 |

\* cited by examiner

ACTUATOR, OPTICAL SCANNING DEVICE, AND MANUFACTURING METHODS

CROSS-REFERENCE TO RELATED APPLICATIONS

The present application is based upon and claims priority to Japanese Patent Application No. 2017-244966 filed on Dec. 21, 2017 and Japanese Patent Application No. 2018-230251 filed on Dec. 7, 2018, the entire contents of which are incorporated herein by reference.

BACKGROUND OF THE INVENTION

1. Field of the Invention

An aspect of this disclosure relates to an actuator, an optical scanning device, and manufacturing methods of the actuator and the optical scanning device.

2. Description of the Related Art

There is a known optical scanning device where a mirror is rotated around a rotational axis to scan light reflected by the mirror by using an actuator including a piezoelectric substance, an upper electrode formed on the upper surface of the piezoelectric substance, and a lower electrode formed on the lower surface of the piezoelectric substance. The actuator also includes an upper wire connected to the upper electrode and a lower wire connected to the lower electrode that are used to apply a voltage to the piezoelectric substance (see, for example, Japanese Laid-Open Patent Publication No. 2016-001325 and Japanese Patent No. 5876329).

The actuator is a Micro Electro Mechanical Systems (MEMS) structure that is deformable in the thickness direction, and employs a bellows structure to reduce the rigidity of the actuator in the thickness direction while maintaining the rigidity of the actuator in the in-plane direction. To manufacture the MEMS structure, shapes corresponding to multiple MEMS structures are formed by patterning a wafer, and the wafer is diced into separate MEMS structures. For example, the wafer is attached to a dicing tape and diced with a dicing blade while supplying water to the wafer.

The MEMS structure implementing the actuator is formed using a silicon-on-insulator (SOI) substrate including a support layer, a buried oxide (BOX) layer, and an active layer. If the bellows structure is formed using only the active layer of the SOI substrate, the bellows structure is not fixed to the dicing tape and is suspended. When the wafer is diced in this state, because the rigidity of the bellows structure is low, the bellows structure may be vibrated and damaged by the flow of water and vibration generated during the dicing.

Accordingly, in a process where MEMS structures used as actuators are manufactured by forming shapes corresponding to the MEMS structures by patterning a wafer and then dicing the wafer fixed to a dicing tape, it is desired to prevent bellows structures from being vibrated and damaged by a water flow and vibration generated during the dicing.

SUMMARY OF THE INVENTION

In an aspect of this disclosure, there is provided an actuator including a first driving beam that is connected to an object to be driven and includes multiple first beams extending in a direction orthogonal to a first predetermined axis, ends of each adjacent pair of the first beams being connected to each other via one of first turnaround parts such that the first driving beam forms a zig-zag bellows structure as a whole; first driving sources formed on first surfaces of the first beams; and ribs formed on second surfaces of the first beams at positions that are closer to the first predetermined axis than the first turnaround parts. The first driving sources are configured to move the first driving beam and thereby rotate the object around the first predetermined axis.

DESCRIPTION OF THE PREFERRED EMBODIMENTS

Embodiments of the present invention are described below with reference to the accompanying drawings. Throughout the accompanying drawings, the same reference numbers are used for the same components, and repeated descriptions of those components may be omitted.

First Embodiment

Figure 1A:
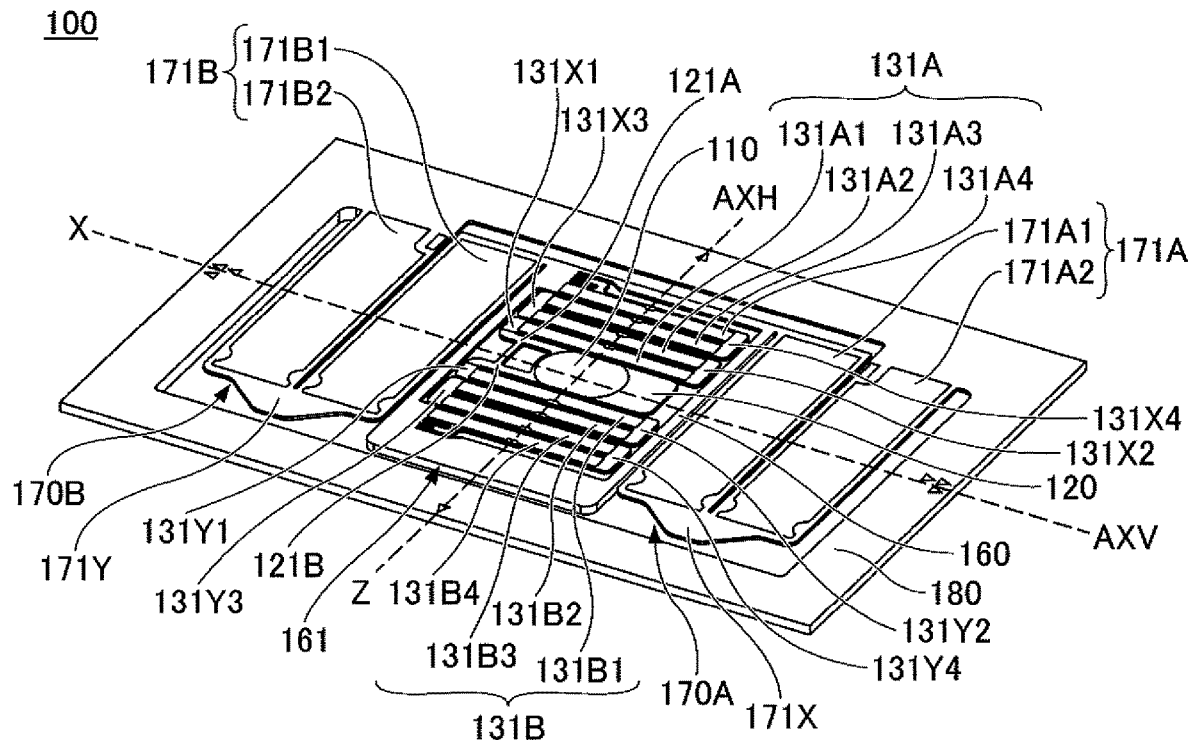
FIGS. 1A and 1B are a top perspective view and a bottom perspective view of an example of an optical scanner of an optical scanning device according to a first embodiment.
Figure 1B:
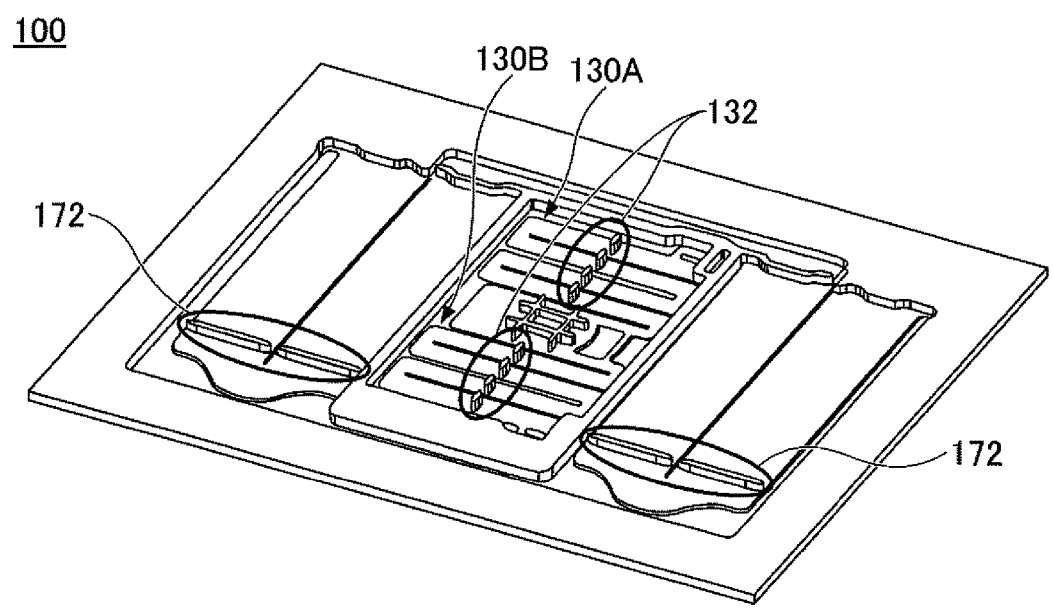
Figure 2:
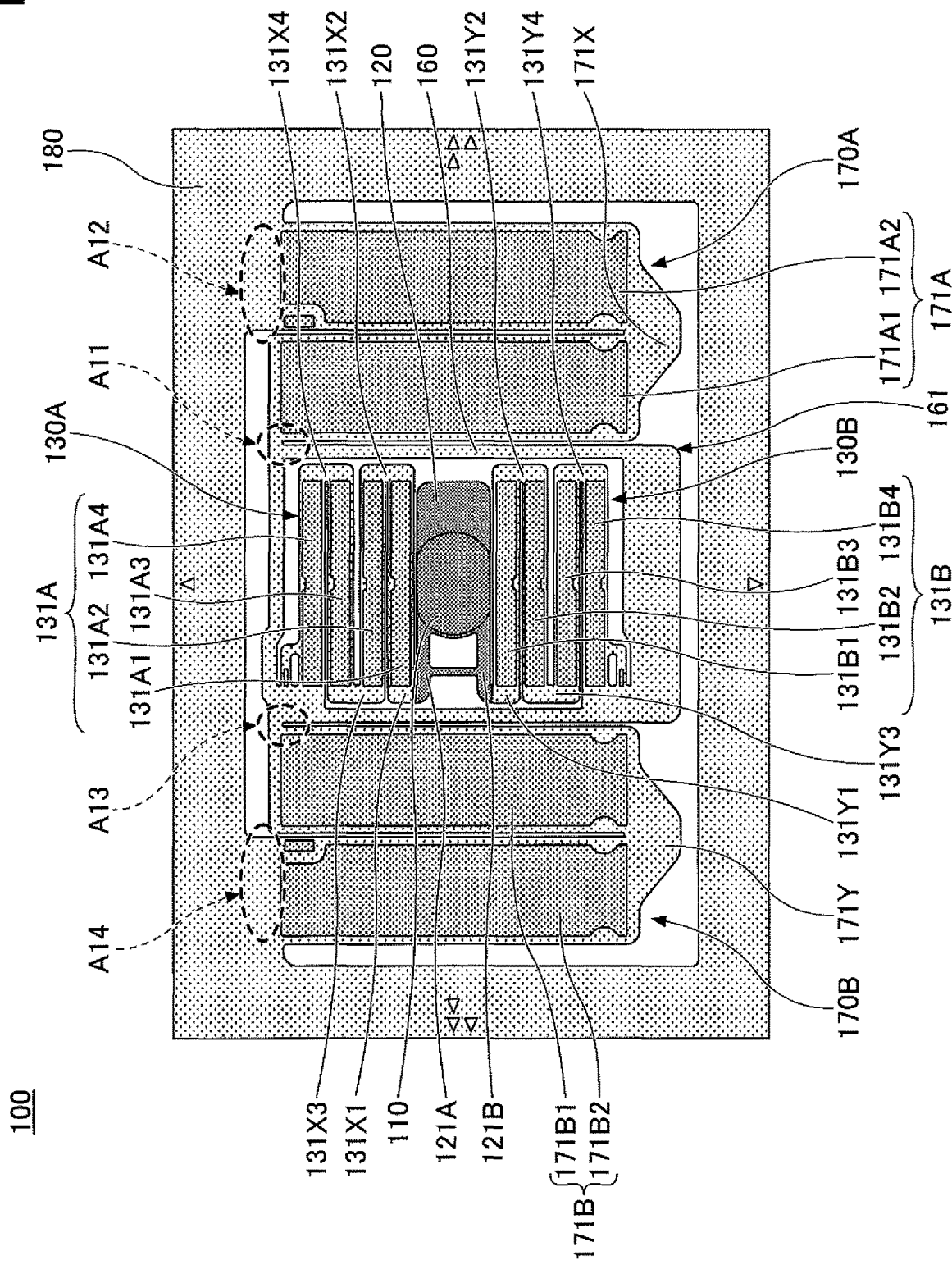
FIG. 2 is a top plan view of the optical scanner of the optical scanning device according to the first embodiment.

FIG. 1A is a top perspective view of an optical scanner 100 of an optical scanning device according to a first embodiment. FIG. 1B is a bottom perspective view of the optical scanner 100 of the optical scanning device according to the first embodiment. FIG. 2 is a top plan view of the optical scanner 100 of the optical scanning device according to the first embodiment. The optical scanner 100 may be housed in a ceramic package including a package body and a package cover.

The optical scanner 100 scans an incoming laser beam emitted by a light source by causing a mirror 110 to rotate (or oscillate). The optical scanner 100 is, for example, a MEMS mirror where the mirror 110 is driven by piezoelectric elements. The mirror 110 of the optical scanner 100 reflects an incoming laser beam and scans the reflected laser beam two-dimensionally.

As illustrated in FIGS. 1A, 1B, and 2, the optical scanner 100 includes the mirror 110, a mirror support 120, coupling beams 121A and 121B, horizontal driving beams 130A and 130B, a movable frame 160, vertical driving beams 170A and 170B, and a fixed frame 180. The mirror 110 is supported on an upper surface of the mirror support 120.

The horizontal driving beams 130A and 130B connected to the mirror support 120 are disposed on the corresponding sides of the mirror support 120 for supporting the mirror 110. The horizontal driving beams 130A and 130B are connected to the mirror support 120 via the coupling beams 121A and 121B. The horizontal driving beams 130A and 130B, the coupling beams 121A and 121B, the mirror support 120, and the mirror 110 are supported by the movable frame 160 surrounding these components. The horizontal driving beam 130A includes multiple rectangular horizontal beams that extend in the direction of a vertical-rotation axis AXV that is orthogonal to a horizontal-rotation axis AXH, and ends of adjacent horizontal beams are connected to each other via turnaround parts 131X2, 131X3, and 131X4 such that the horizontal driving beam 130A forms a zig-zag bellows structure as a whole. One end of the horizontal driving beam 130A is connected to the inner side of the movable frame 160, and another end of the horizontal driving beam 130A is connected via a turnaround part 131X1 and the coupling beam 121A to the mirror support 120. The horizontal driving beam 130B includes multiple rectangular horizontal beams that extend in the direction of the vertical-rotation axis AXV that is orthogonal to the horizontal-rotation axis AXH, and ends of adjacent horizontal beams are connected to each other via turnaround parts 131Y2, 131Y3, and 131Y4 such that the horizontal driving beam 130B forms a zig-zag bellows structure as a whole. One end of the horizontal driving beam 130B is connected to the inner side of the movable frame 160, and another end of the horizontal driving beam 130B is connected via a turnaround part 131Y1 and the coupling beam 121B to the mirror support 120.

The vertical driving beams 170A and 170B connected to the movable frame 160 are disposed on the corresponding sides of the movable frame 160. The vertical driving beam 170A includes multiple rectangular vertical beams that extend in the direction of the horizontal-rotation axis AXH, and ends of adjacent vertical beams are connected to each other via a turnaround part 171X such that the vertical driving beam 170A forms a zig-zag bellows structure as a whole. One end of the vertical driving beam 170A is connected to the inner side of the fixed frame 180, and another end of the vertical driving beam 170A is connected to the outer side of the movable frame 160. The vertical driving beam 170B includes multiple rectangular vertical beams that extend in the direction of the horizontal-rotation axis AXH, and ends of adjacent vertical beams are connected to each other via a turnaround part 171Y such that the vertical driving beam 170B forms a zig-zag bellows structure as a whole. One end of the vertical driving beam 170B is connected to the inner side of the fixed frame 180, and another end of the vertical driving beam 170B is connected to the outer side of the movable frame 160.

The horizontal driving beams 130A and 130B include horizontal driving sources 131A and 131B, respectively. Also, the vertical driving beams 170A and 170B include vertical driving sources 171A and 171B, respectively. The horizontal driving beams 130A and 130B and the vertical driving beams 170A and 170B function as an actuator that causes the mirror 110 to rotate (or oscillate) vertically and horizontally to scan a laser beam.

On the upper surfaces of the horizontal driving beams 130A and 130B, the horizontal driving sources 131A and 131B are formed for respective horizontal beams that are rectangular units including no curved section. Each horizontal driving source 131A includes a piezoelectric thin film formed on the upper surface of the horizontal driving beam 130A, an upper electrode formed on the upper surface of the piezoelectric thin film, and a lower electrode formed on the lower surface of the piezoelectric thin film. Each horizontal driving source 131B includes a piezoelectric thin film formed on the upper surface of the horizontal driving beam 130B, an upper electrode formed on the upper surface of the piezoelectric thin film, and a lower electrode formed on the lower surface of the piezoelectric thin film.

In each of the horizontal driving beams 130A and 130B, a driving voltage with a first waveform and a driving voltage with a second waveform obtained by vertically inverting the first waveform with reference to the median value of the first waveform are applied to horizontal driving sources 131A/131B on adjacent horizontal beams to cause the adjacent horizontal beams to warp in opposite vertical directions, and the accumulation of the vertical movement of the horizontal beams is transmitted to the mirror support 120. With the movement of the horizontal driving beams 130A and 130B, the mirror 110 and the mirror support 120 rotate (or oscillate) around the horizontal-rotation axis AXH. The direction of this rotation (or oscillation) is referred to as a horizontal direction, and the axis of this rotation (or oscillation) that passes through the center of the light reflection surface of the mirror 110 is referred to as the horizontal-rotation axis AXH. For example, nonresonant oscillation may be used for the horizontal driving by the horizontal driving beams 130A and 130B.

For example, the horizontal driving source 131A includes horizontal driving sources 131A1, 131A2, 131A3, and 131A4 that are formed on the first through fourth horizontal beams constituting the horizontal driving beam 130A. The horizontal driving source 131B includes horizontal driving sources 131B1, 131B2, 131B3, and 131B4 that are formed on the first through fourth horizontal beams constituting the horizontal driving beam 130B. In this case, the mirror 110 and the mirror support 120 can be rotated in the horizontal direction by driving the horizontal driving sources 131A1, 131B1, 131A3, and 131B3 using the first waveform and driving the horizontal driving sources 131A2, 131B2, 131A4, and 131B4 using the second waveform that is obtained by vertically inverting the first waveform with reference to the median value of the first waveform.

On the upper surfaces of the vertical driving beams 170A and 170B, the vertical driving sources 171A and 171B are formed for respective vertical beams that are rectangular units including no curved section. Each vertical driving source 171A includes a piezoelectric thin film formed on the upper surface of the vertical driving beam 170A, an upper electrode formed on the upper surface of the piezoelectric thin film, and a lower electrode formed on the lower surface of the piezoelectric thin film. Each vertical driving source 171B includes a piezoelectric thin film formed on the upper surface of the vertical driving beam 170B, an upper electrode formed on the upper surface of the piezoelectric thin film, and a lower electrode formed on the lower surface of the piezoelectric thin film.

In each of the vertical driving beams 170A and 170B, a driving voltage with a first waveform and a driving voltage with a second waveform obtained by vertically inverting the first waveform with reference to the median value of the first waveform are applied to vertical driving sources 171A/171B on adjacent vertical beams to cause the adjacent vertical beams to warp in opposite vertical directions, and the accumulation of the vertical movement of the vertical beams is transmitted to the movable frame 160. With the movement of the vertical driving beams 170A and 170B, the mirror 110 and a mirror support structure 161 rotate (or oscillate) around a rotation axis that is orthogonal to the horizontal-rotation axis AXH. The direction of this rotation (or oscillation) is referred to as a vertical direction, and this rotation axis that passes through the center of the light reflection surface of the mirror 110 is referred to as a vertical-rotation axis AXV. For example, nonresonant oscillation may be used for the vertical driving by the vertical driving beams 170A and 170B.

For example, the vertical driving source 171A includes vertical driving sources 171A1 and 171A2 that are formed on the first and second vertical beams constituting the vertical driving beam 170A. The vertical driving source 171B includes vertical driving sources 171B1 and 171B2 that are formed on the first and second vertical beams constituting the vertical driving beam 170B. In this case, the movable frame 160 connected to the mirror 110 can be rotated in the vertical direction by driving the vertical driving sources 171A1 and 171B1 using the first waveform and driving the vertical driving sources 171A2 and 171B2 using the second waveform that is obtained by vertically inverting the first waveform with reference to the median value of the first waveform.

In the optical scanning device of the first embodiment, the MEMS structure implementing the actuator is formed of an SOI substrate including a support layer, a buried oxide (BOX) layer, and an active layer. Each of the fixed frame 180 and the movable frame 160 is comprised of the support layer, the BOX layer, and the active layer. On the other hand, each of components such as the horizontal driving beams 130A and 130B and the vertical driving beams 170A and 170B other than the fixed frame 180 and the movable frame 160 may be comprised of the active layer, i.e., one layer, or the BOX layer and the active layer, i.e., two layers.

In the optical scanning device of the first embodiment, the horizontal driving sources 131A and 131B are formed on first surfaces (upper surfaces) of the horizontal beams constituting the horizontal driving beams 130A and 130B, and ribs 132 are formed on second surfaces (lower surfaces) of the horizontal beams at positions that are closer to the horizontal-rotation axis AXH than the turnaround parts 131X1, 131X2, 131X3, 131X4, 131Y1, 131Y2, 131Y3, and 131Y4. As illustrated in FIG. 1B, the ribs 132 are formed on the horizontal-rotation axis AXH corresponding to the center of the horizontal beams constituting the horizontal driving beams 130A and 130B.

The height of the ribs 132 formed on the second surfaces (lower surfaces) of the horizontal beams constituting the horizontal driving beams 130A and 130B is the same as the thickness of the fixed frame 180 and the movable frame 160. When the MEMS structure that functions as an actuator of the optical scanning device is formed of an SOI substrate, each of the ribs 132 is comprised of a support layer, a BOX layer, and an active layer.

Also in the optical scanning device of the first embodiment, the vertical driving sources 171A and 171B are formed on first surfaces (upper surfaces) of the vertical beams constituting the vertical driving beams 170A and 170B, and ribs 172 are formed on second surfaces (lower surfaces) of the vertical beams. For example, the ribs 172 are formed at the boundaries between the vertical beams and the turnaround parts 171X and 171Y. A rib is also formed on the lower surface of the mirror support 120 that is opposite a surface of the mirror support 120 on which the mirror 110 is formed. The ribs 172 formed on the second surfaces (lower surfaces) of the vertical beams constituting the vertical driving beams 170A and 170B and the rib formed on the lower surface of the mirror support 120 are provided, for example, to prevent the mirror support 120 and the vertical driving beams 170A and 170B from unnecessarily warping in a direction (the width (or lateral) direction of the vertical driving beams 170A and 170B) that is orthogonal to the direction of vertical warping of the mirror support 120 and the vertical driving beams 170A and 170B.

In the optical scanning device of the first embodiment described above, the ribs 132 are formed on the second surfaces (lower surfaces) of the horizontal beams constituting the horizontal driving beams 130A and 130B. When a wafer including multiple MEMS structures is fixed to a dicing tape and diced to manufacture separate MEMS structures each of which is used as an actuator of the optical scanning device, the ribs 132 attached to the dicing tape can prevent the horizontal driving beams 130A and 130B from being excessively vibrated and damaged by a water flow and vibration generated during the dicing. When ribs are provided on turnaround parts of a bellows structure, the ribs increase the weight of the bellows that vibrates in a mode where the bellows is tilted in the longitudinal direction. This in turn decreases the resonant frequency and increases the vibration. In the first embodiment, the ribs 132 are formed on the second surfaces (lower surfaces) of the horizontal beams at positions that are closer to the horizontal-rotation axis AXH than the turnaround parts 131X1, 131X2, 131X3, 131X4, 131Y1, 131Y2, 131Y3, and 131Y4. This configuration makes it possible to reduce the variation in frequency characteristics in relation to the tilting direction of the bellows and prevent the bellows from being damaged during dicing.

Figure 3:
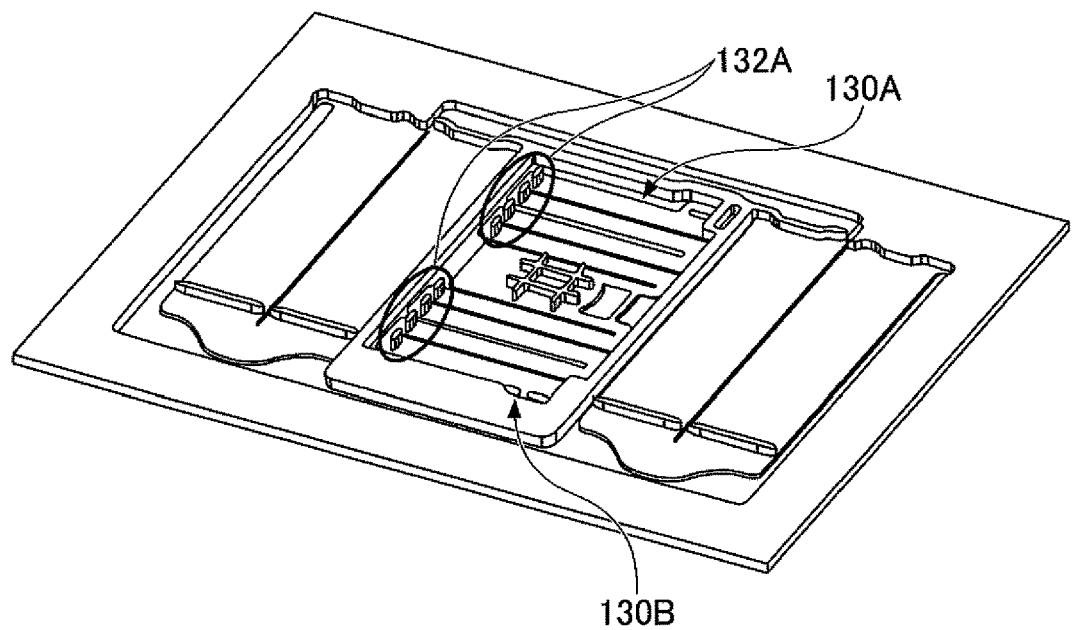
FIG. 3 is a bottom perspective view of an optical scanner of an optical scanning device according to a variation of the first embodiment.

FIG. 3 is a bottom perspective view of an optical scanner 100A of an optical scanning device according to a variation of the first embodiment. An optical scanner 100A illustrated in FIG. 3 is different from the optical scanner 100 illustrated in FIGS. 1A, 1B, and 2 in that ribs 132A are formed near the turnaround parts 131X1, 131X2, 131X3, 131X4, 131Y1, 131Y2, 131Y3, and 131Y4 instead of on the horizontal-rotation axis AXH. Other configurations of the optical scanner 100A are substantially the same as those of the optical scanner 100.

In the optical scanner 100A, the ribs 132A are formed on the second surfaces (lower surfaces) of the horizontal beams constituting the horizontal driving beams 130A and 130B. When a wafer including multiple MEMS structures is fixed to a dicing tape and diced to manufacture separate MEMS structures each of which is used as an actuator of the optical scanning device, the ribs 132A attached to the dicing tape can prevent the horizontal driving beams 130A and 130B from being excessively vibrated and damaged by a water flow and vibration generated during the dicing. This configuration makes it possible to reduce the variation in frequency characteristics in relation to the tilting direction of the bellows and prevent the bellows from being damaged during dicing.

Figure 4:
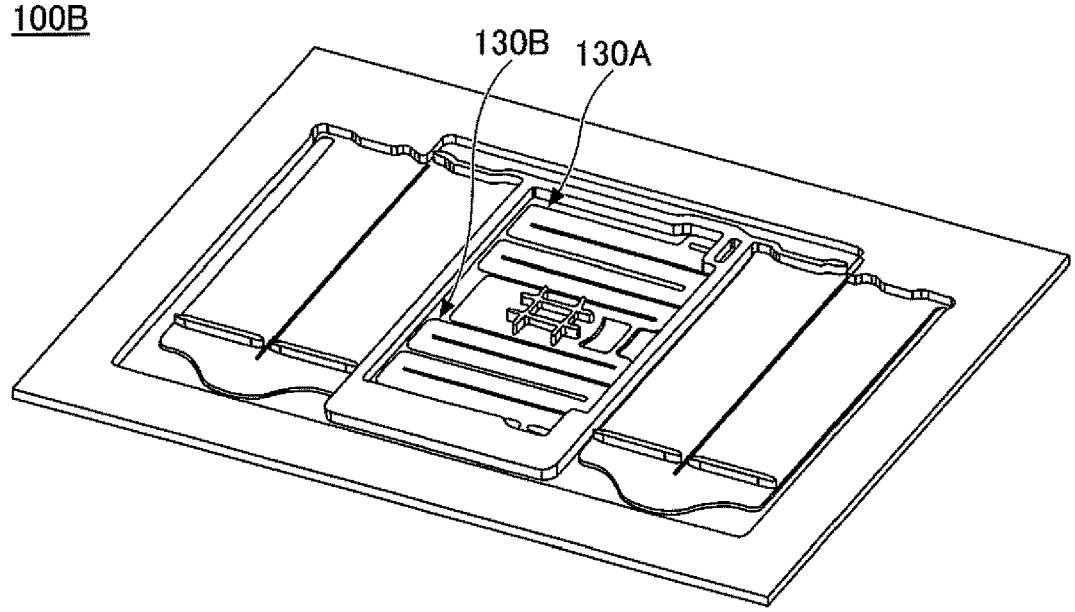
FIG. 4 is a top perspective view of an optical scanner of an optical scanning device according to a comparative example.

FIG. 4 is a bottom perspective view of an optical scanner of an optical scanning device according to a comparative example. An optical scanner 100B illustrated in FIG. 4 is different from the optical scanner 100 illustrated in FIGS. 1A, 1B, and 2 in that ribs are not formed on the second surfaces (lower surfaces) of the horizontal beams constituting the horizontal driving beams 130A and 130B. Other configurations of the optical scanner 100B are substantially the same as those of the optical scanner 100.

With the configuration of the optical scanner 100B of the comparative example, when a wafer including multiple MEMS structures is fixed to a dicing tape and diced to manufacture separate MEMS structures each of which corresponds to the optical scanner 100B, the horizontal driving beams 130A and 130B are vibrated and damaged by a water flow and vibration generated during the dicing.

Figure 5:
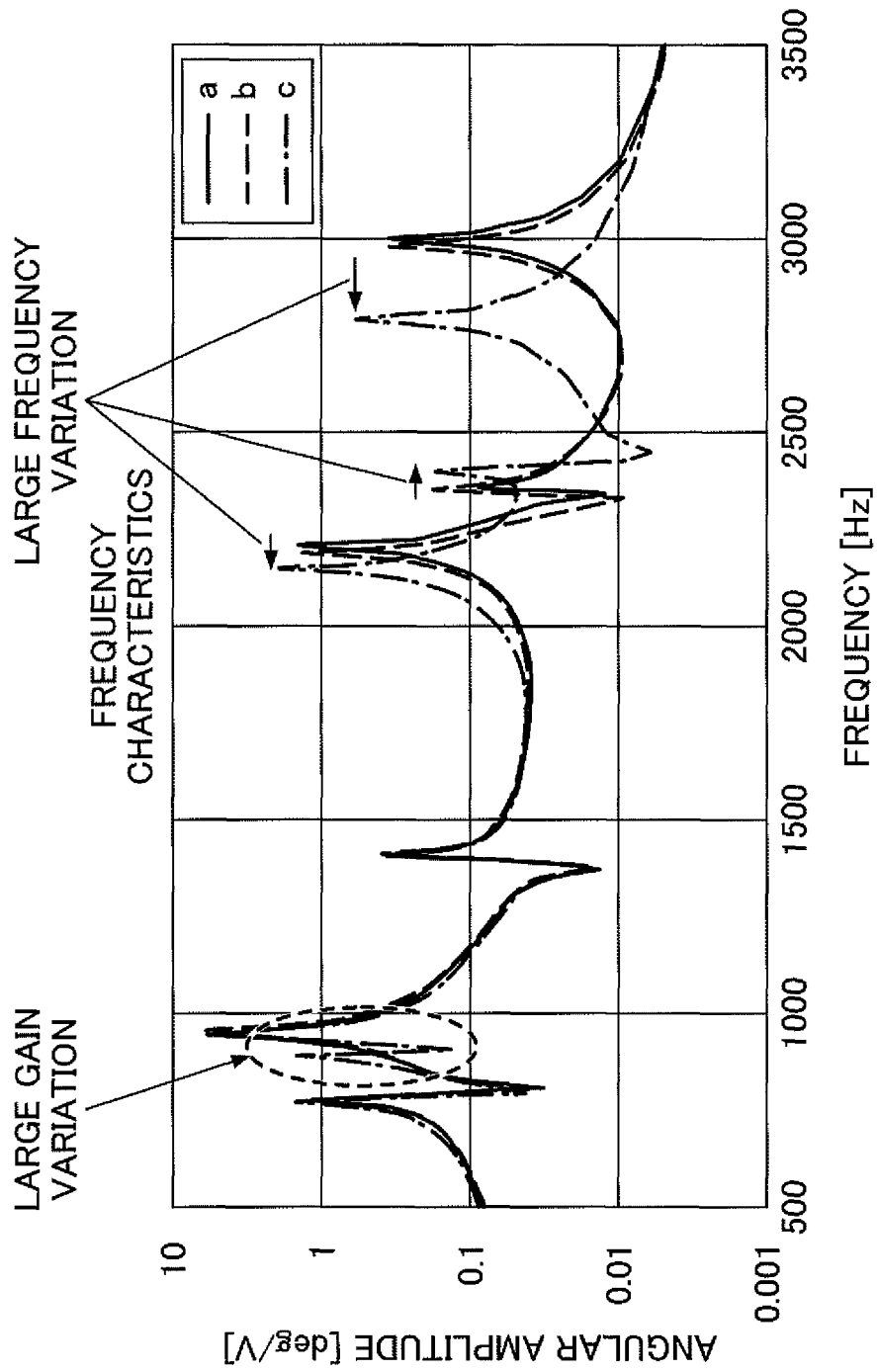
FIG. 5 is a graph indicating frequency characteristics of optical scanners in relation to angular amplitudes.

FIG. 5 is a graph indicating frequency characteristics of optical scanners in relation to angular amplitudes. In FIG. 5, a solid line "a" indicates the frequency characteristic of the optical scanner 100B of the comparative example illustrated in FIG. 4, a dotted line "b" indicates the frequency characteristic of the optical scanner 100 of the first embodiment illustrated in FIGS. 1A, 1B, and 2, and a dashed-dotted line "c" indicates the frequency characteristic of the optical scanner 100A according to a variation of the first embodiment illustrated in FIG. 3.

The frequency characteristics in FIG. 5 are obtained by simulations. In the simulations, the fixed frame of each of the optical scanners is fixed, and angular amplitudes of the optical scanners in the direction of the horizontal-rotation axis AXH are obtained by applying voltages of ±1V to the horizontal driving sources 131A2, 131A4, 131B2, and 131B4 on odd-numbered horizontal beams of the horizontal driving beams 130A and 130B counted from the outer side. In FIG. 5, the vertical axis indicates angular amplitudes in the direction of the horizontal-rotation axis AXH, and the horizontal axis indicates frequencies of applied voltages.

As indicated by FIG. 5, the optical scanner 100 (dotted line "b") of the first embodiment where the ribs 132 are formed on the horizontal-rotation axis AXH corresponding to the center of the horizontal beams constituting the horizontal driving beams 130A and 130B has a frequency characteristic that is substantially the same as the frequency characteristic of the optical scanner 100B (solid line "a") of the comparative example where no rib is formed. This indicates that forming the ribs 132 on the horizontal-rotation axis AXH corresponding to the center of the horizontal beams constituting the horizontal driving beams 130A and 130B does not substantially change the frequency characteristic of the horizontal driving beams 130A and 130B. Thus, the configuration of the optical scanner 100 of the first embodiment makes it possible to prevent the horizontal driving beams 130A and 130B from being damaged during dicing without changing the frequency characteristic of the horizontal driving beams 130A and 130B.

On the other hand, compared with the optical scanner 100B (solid line "a") of the comparative example where no rib is formed, the optical scanner 100A (dashed-dotted line "c") where the ribs 132A are formed near the turnaround parts 131X1, 131X2, 131X3, 131X4, 131Y1, 131Y2, 131Y3, and 131Y4 exhibits a large gain variation in a range between 700 Hz and 1000 Hz and exhibits a large frequency variation in a range between 2000 Hz and 3000 Hz. Thus, forming the ribs 132A near the turnaround parts 131X1, 131X2, 131X3, 131X4, 131Y1, 131Y2, 131Y3, and 131Y4 of the horizontal beams constituting the horizontal driving beams 130A and 130B changes the frequency characteristic of the horizontal driving beams 130A and 130B. Thus, the configuration of the optical scanner 100A according to a variation of the first embodiment makes it possible to prevent the horizontal driving beams 130A and 130B from being damaged during dicing while changing the frequency characteristic of the horizontal driving beams 130A and 130B within a practicable range.

Figure 6A:
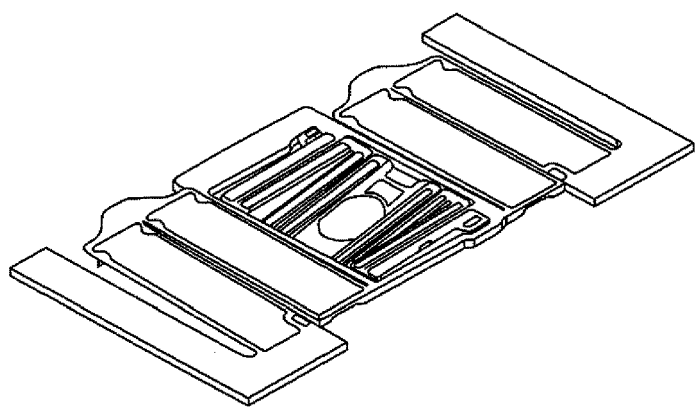
FIGS. 6A through 6D are drawings used to describe eigenmodes of an optical scanning device.
Figure 6B:
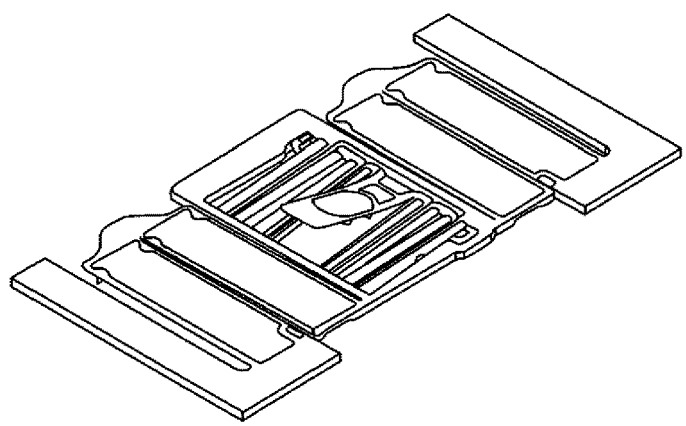
Figure 6C:
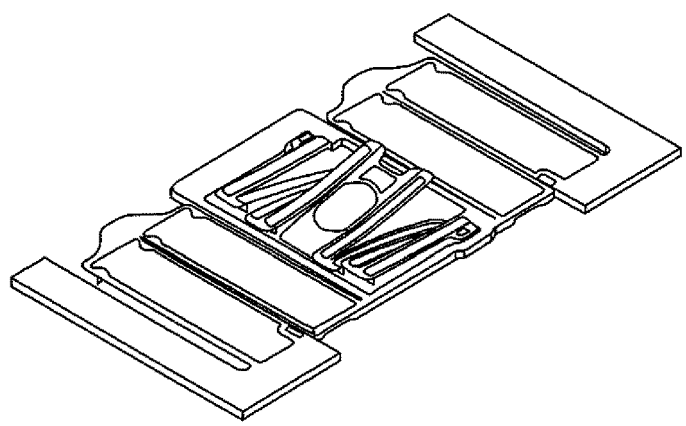
Figure 6D:
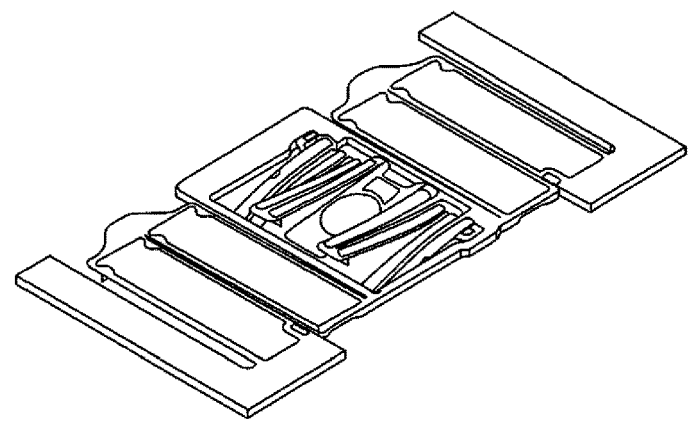

FIGS. 6A through 6D are drawings used to describe eigenmodes of the optical scanning device. FIG. 6A illustrates the positions and attitudes of the driving beams and the mirror when the optical scanning device of the first embodiment is in a 900 Hz mode. FIG. 6B illustrates the positions and attitudes of the driving beams and the mirror when the optical scanning device of the first embodiment is in a 2200 Hz mode. FIG. 6C illustrates the positions and attitudes of the driving beams and the mirror when the optical scanning device of the first embodiment is in a 2400 Hz mode. FIG. 6D illustrates the positions and attitudes of the driving beams and the mirror when the optical scanning device of the first embodiment is in a 2800 Hz mode.

The optical scanning device of the first embodiment could be stably driven within a frequency range between 900 Hz and 2800 Hz without exhibiting abnormal vibration that may damage the MEMS structure.

Figure 7A:
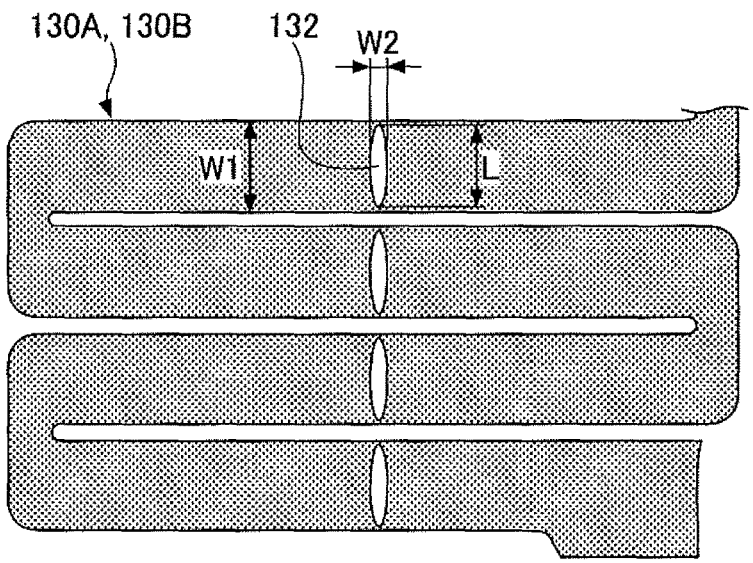
FIG. 7A is an enlarged view of a part of an optical scanner of an optical scanning device.

FIG. 7A illustrates a configuration of an optical scanning device used in a simulation to measure tilt angle sensitivities relative to the width and the length of ribs. FIG. 7A illustrates only a portion of the horizontal driving beam 130A/130B. The horizontal driving beam 130A/130B (or each horizontal beam) has a width W1 (in a direction that is orthogonal to the direction in which the horizontal beam extends), and each rib 132 provided on the horizontal driving beam 130A/130B has a length L (in a direction that is orthogonal to the direction in which the horizontal beam extends) and a width W2 (in the direction in which the horizontal beam extends). The direction in which the horizontal beam extends is the direction of the vertical-rotation axis AXV, and the direction orthogonal to the direction in which the horizontal beam extends is the direction of the horizontal-rotation axis AXH. The height of the rib 132 is the same as the height of the movable frame 160 and the fixed frame 180. Other configurations of the optical scanning device of FIG. 7 are substantially the same as the configurations illustrated in FIGS. 1A, 1B, and 2.

Figure 7B:
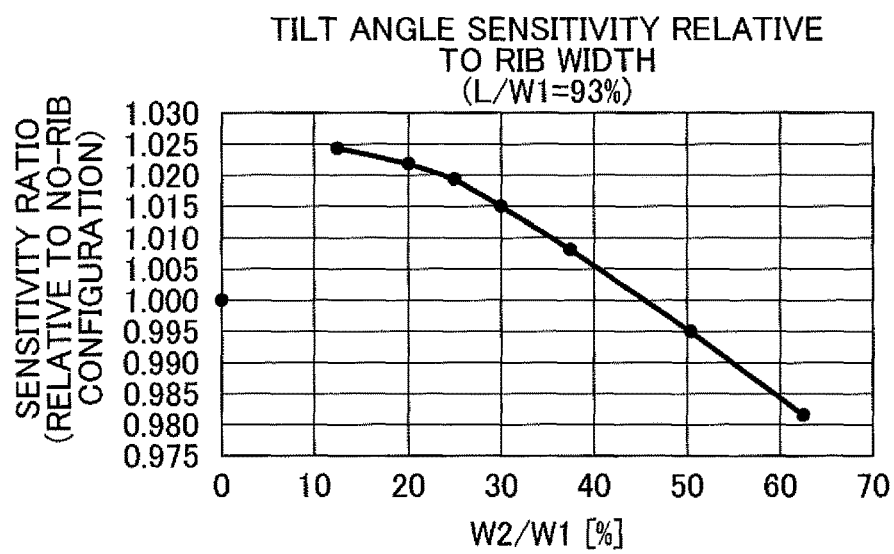
FIGS. 7B and 7C are graphs indicating tilt angle sensitivities of an optical scanning device.

FIG. 7B is a graph indicating tilt angle sensitivities of the optical scanning device of FIG. 7A obtained by a simulation where the optical scanning device is DC-driven. In FIG. 7B, the vertical axis indicates the ratio of the sensitivity of the optical scanning device of FIG. 7A to the sensitivity (which is assumed to be "1") of the optical scanning device of FIG. 4 including no rib. The horizontal axis indicates a percentage (W2/W1) of the width W2 of the rib 132 in the width W1 of the horizontal beam. In the simulation of FIG. 7B, the percentage (L/W1) of the length L of the rib 132 in the width W1 of the horizontal beam is fixed at 93%. When W2/W1 is less than or equal to 50%, the ratio of the tilt angle sensitivity becomes greater than or equal to about 1, i.e., the tilt angle sensitivity of the optical scanning device of FIG. 7 becomes greater than or equal to the tilt angle sensitivity of the optical scanning device including no rib. Thus, the value of W2/W1 is preferably less than or equal to 50%.

Figure 7C:
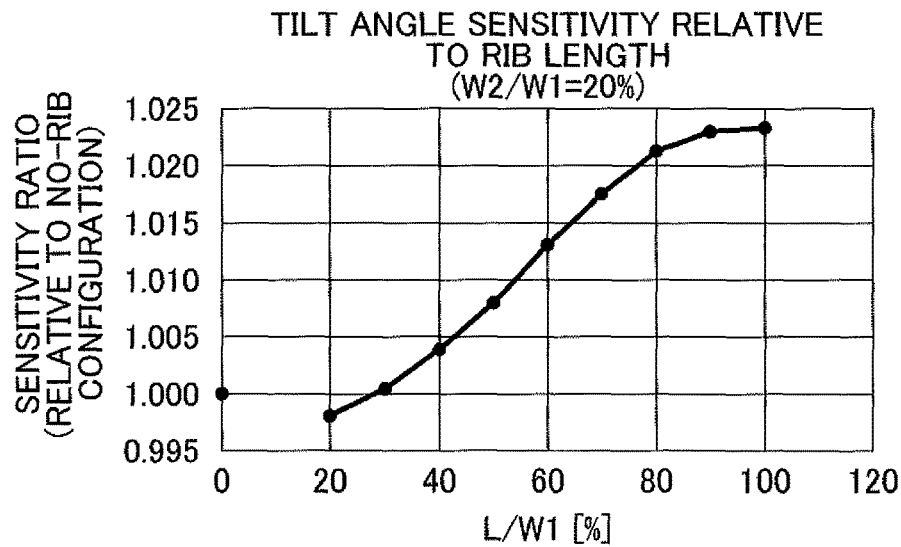

FIG. 7C is a graph indicating tilt angle sensitivities of the optical scanning device of FIG. 7A obtained by a simulation where the optical scanning device is DC-driven. In FIG. 7C, the vertical axis indicates the ratio of the sensitivity of the optical scanning device of FIG. 7A to the sensitivity (which is assumed to be "1") of the optical scanning device of FIG. including no rib. The horizontal axis indicates a percentage (L/W1) of the length L of the rib 132 in the width W1 of the horizontal beam. In the simulation of FIG. 7C, the percentage (W2/W1) of the width W2 of the rib 132 in the width W1 of the horizontal beam is fixed at 20%. When L/W1 is greater than or equal to 30%, the ratio of the tilt angle sensitivity becomes greater than or equal to about 1, i.e., the tilt angle sensitivity of the optical scanning device of FIG. 7 becomes greater than or equal to the tilt angle sensitivity of the optical scanning device including no rib. Thus, the value of L/W1 is preferably greater than or equal to 30%.

As described above, the dimensions of the rib 132 are preferably determined such that W2/W1 becomes less than or equal to 50% and L/W1 becomes greater than or equal to 30%. That is, the rib 132 has a width in the longitudinal direction of the horizontal beam and a length in the lateral direction of the horizontal beam, and the width of the rib 132 is preferably shorter than the length of the rib 132. This is assumed to be because the rib 132 prevents the horizontal beam from warping in the lateral direction (a direction orthogonal to the direction in which the horizontal beam extends) and thereby reduces the warping rigidity of the horizontal beam in the longitudinal direction (the direction in which the horizontal beam extends).

The tilt angle sensitivity decreases as the width W2 of the rib 132 increases and the length L of the rib 132 decreases. Therefore, the width W2 and the length L of the rib 132 preferably satisfy L/W2>2.

Next, a method of manufacturing a MEMS structure used as the actuator of the optical scanning device of the first embodiment is described with reference to FIGS. 8A through 9C. FIGS. 8A through 9C are cross sections that indicate manufacturing steps and are taken along line X-Z in FIG. 1A that passes through the center of the mirror 110.

Figure 8A:
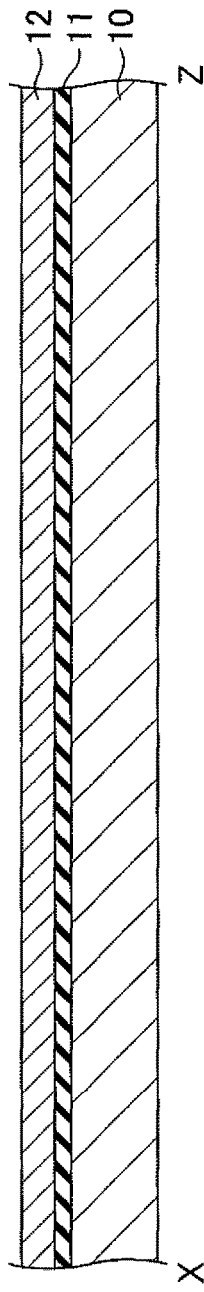
FIGS. 8A through 8C are drawings illustrating a manufacturing process of an actuator of the optical scanning device according to the first embodiment.
Figure 8B:
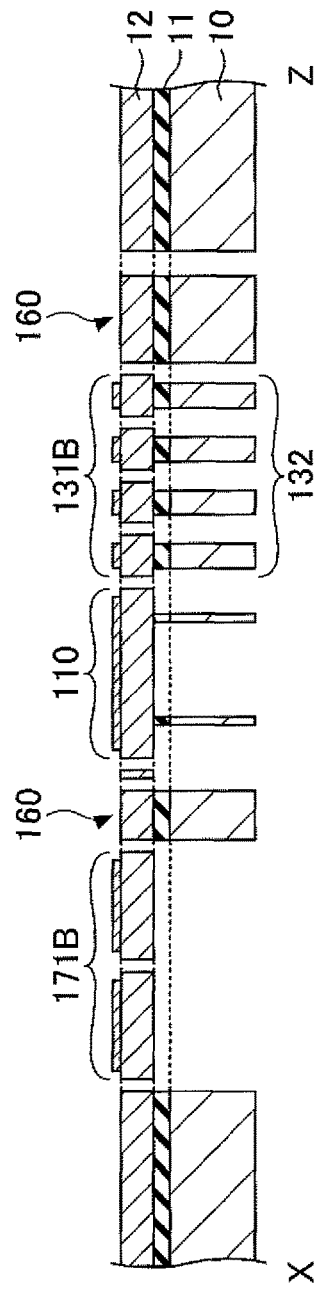

First, as illustrated in FIG. 8A, an SOI substrate including a support layer 10, a BOX layer 11, and an active layer 12 is prepared. Next, as illustrated in FIG. 8B, the SOI substrate is etched using a patterned photoresist film to form an integrated substrate including multiple actuators. Each of the actuators includes the movable frame 160, the mirror support 120 disposed inside of the movable frame 160, the mirror 110 formed on the upper surface of the mirror support 120, the horizontal driving beams 130A and 130B on which the horizontal driving sources 131A and 131B (131A is not shown) are formed, and the vertical driving beams 170A and 170B on which the vertical driving sources 171A and 171B (171A is not shown) are formed. The vertical driving beams 170A and 170B connect the movable frame 160 to the fixed frame 180 surrounding the movable frame 160. Here, in the state of the integrated substrate, the fixed frame 180 has not been cut out. Also, the ribs 132 are formed on the lower surfaces of the horizontal beams constituting the horizontal driving sources 131A and 131B. In this example, the ribs 132 are formed on the horizontal-rotation axis AXH corresponding to the center of the horizontal beams.

Figure 8C:
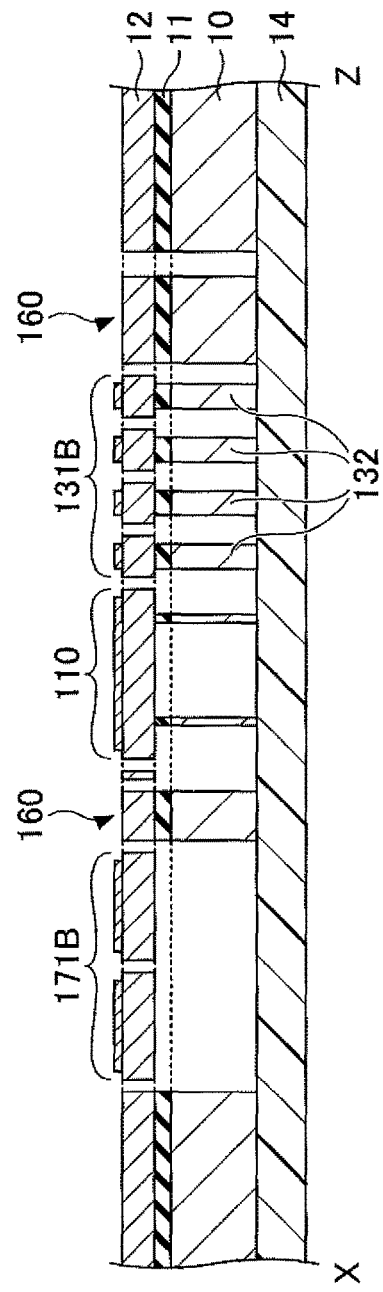

Next, as illustrated in FIG. 8C, as a preparation for dicing the SOI substrate (the integrated substrate), a dicing tape 14 is attached to a side (corresponding to the support layer 10) of the SOI substrate on which the ribs 132 are formed and that is opposite the side (corresponding to the active layer 12) of the SOI substrate on which the mirror 110, the horizontal driving beams 130A and 130B, and the vertical driving beams 170A and 170B are formed. In this step, the dicing tape 14 needs to be securely attached to the lower surfaces of the ribs 132.

Figure 9A:
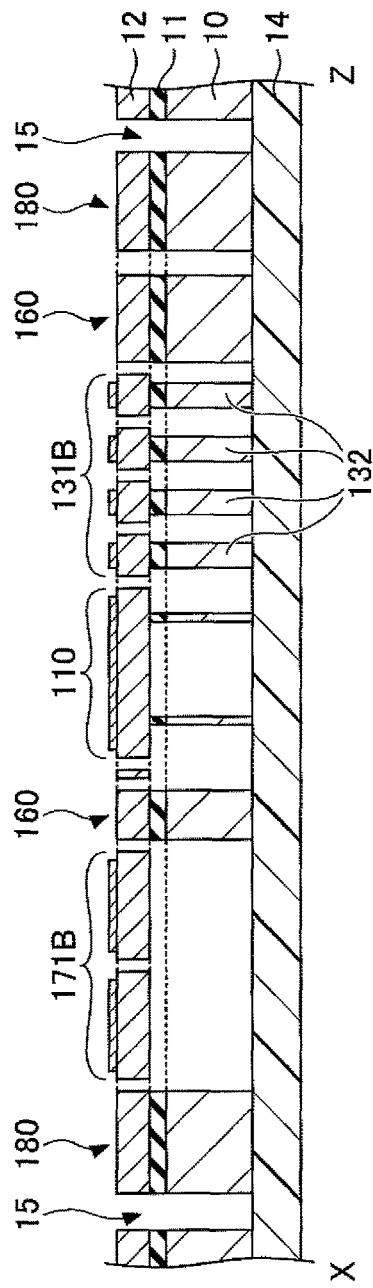
FIGS. 9A through 9C are drawings illustrating a manufacturing process of the actuator of the optical scanning device according to the first embodiment.

Next, as illustrated in FIG. 9A, dicing grooves 15 are formed in the SOI substrate along dicing lines to dice the SOI substrate into separate actuators or MEMS structures. The fixed frame 180 is formed as a result of this step. Here, if the horizontal beams are suspended, the horizontal beams may be damaged by a water flow and vibration applied to each MEMS structure during the dicing. However, with the manufacturing method of the first embodiment where the ribs 132 are attached to and fixed by the dicing tape 14, the horizontal beams can be prevented from being damaged.

Figure 9B:
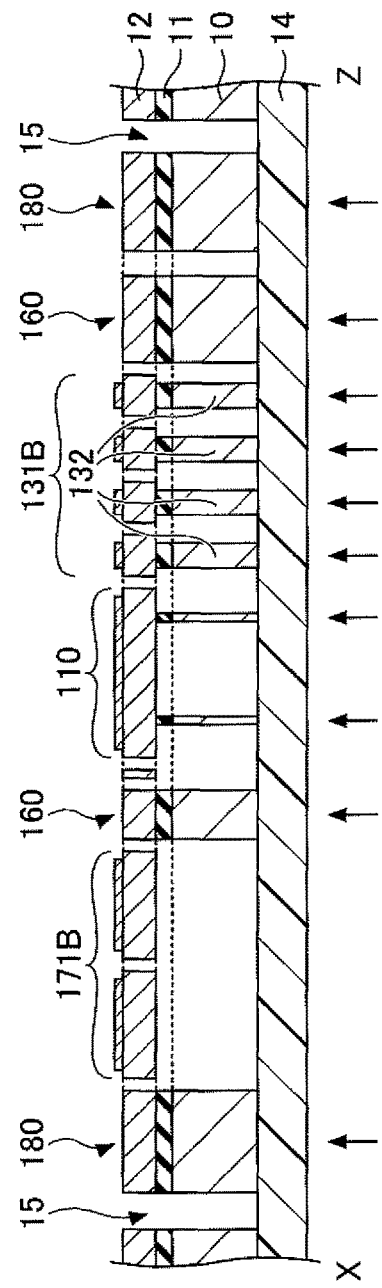
Figure 9C:
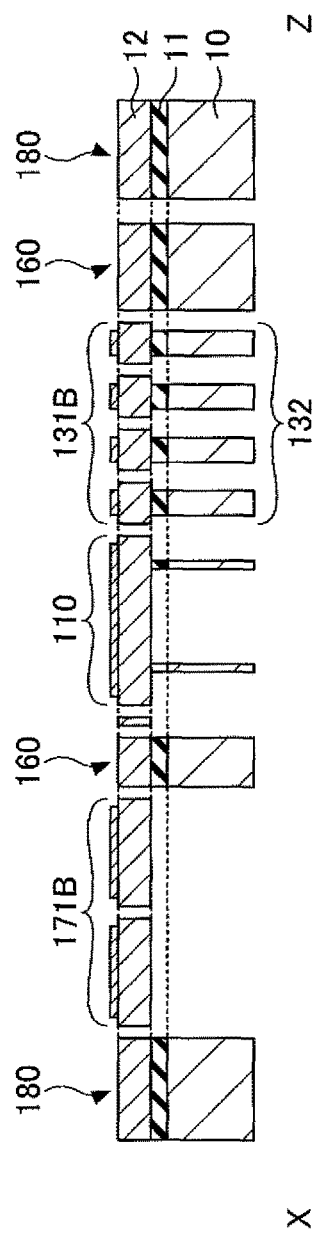

Next, as illustrated in FIG. 9B, the fixed frame 180, the movable frame 160, and the ribs 132 where the support layer 10 remains are pressed via the dicing tape 14 by using a jig. As a result, as illustrated in FIG. 9C, separate MEMS structures, each of which functions as an actuator of the optical scanning device, are removed from the dicing tape 14. The actuator of the optical scanning device of the first embodiment is manufactured through the above process.

Second Embodiment

Figure 10:
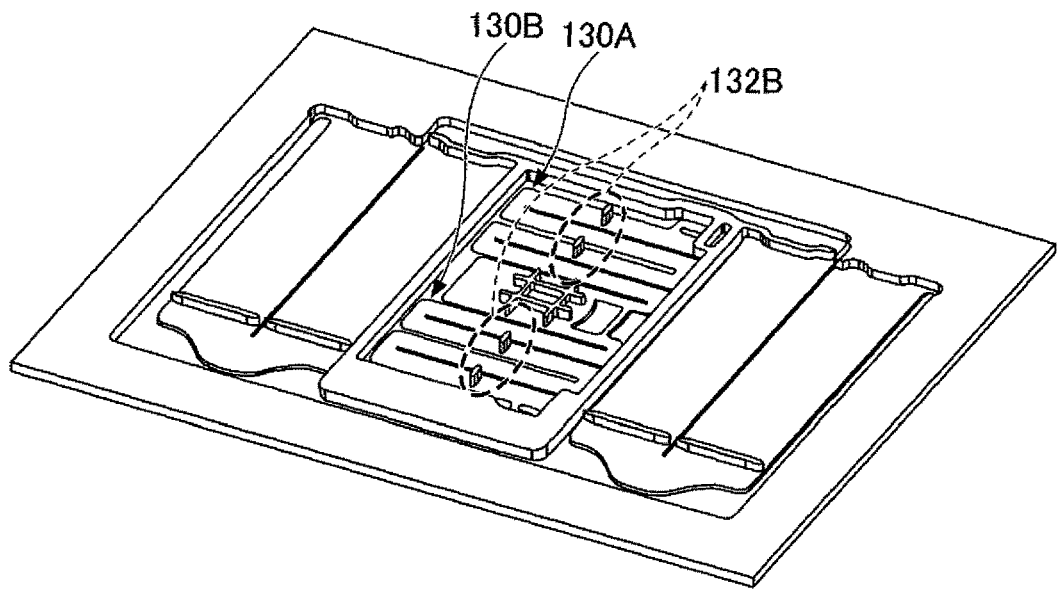
FIG. 10 is a bottom perspective view of an optical scanner of an optical scanning device according to a second embodiment.

FIG. 10 is a bottom perspective view of an optical scanner 100C of an optical scanning device according to a second embodiment. In the optical scanner 100C, ribs 132B are formed on alternate horizontal beams constituting the horizontal driving beams 130A and 130B. In other words, a horizontal beam with the rib 132B and a horizontal beam without the rib 132B are arranged alternately and adjacent to each other. Other configurations of the optical scanner 100C are substantially the same as those of the optical scanner 100 of the first embodiment. More specifically, in the optical scanner 100C or the actuator of the second embodiment, the ribs 132B are formed only on odd-numbered horizontal beams, which are counted from the outer side, among the horizontal beams constituting the horizontal driving beams 130A and 130B. Alternatively, the ribs 132B may be formed only on even-numbered horizontal beams. If two or more horizontal beams without the rib 132B are arranged consecutively, the horizontal beams become more likely to be deformed when they are fixed to a dicing tape. Accordingly, it is preferable to not arrange two or more horizontal beams without the rib 132B consecutively.

In the example of FIG. 10, the ribs 132B are provided on the first and third horizontal beams from the outer side. However, the ribs 132B may be provided on the second and fourth horizontal beams from the outer side or on the second and third horizontal beams from the outer side.

The degree of difference in frequency characteristics between actuators with and without ribs depends on the position and the number of ribs provided in the actuator with ribs. If the position of ribs is fixed, the difference in frequency characteristics becomes smaller as the number of ribs decreases. Therefore, an optical scanning device and an actuator with ribs can be designed using designs of an optical scanning device and an actuator without ribs.

In the optical scanning device of the second embodiment described above, the ribs 132B are formed on the second surfaces (lower surfaces) of the horizontal beams constituting the horizontal driving beams 130A and 130B. When a wafer including multiple MEMS structures is fixed to a dicing tape and diced to manufacture separate MEMS structures each of which is used as an actuator of the optical scanning device, the ribs 132B attached to the dicing tape can prevent the horizontal driving beams 130A and 130B from being excessively vibrated and damaged by a water flow and vibration generated during the dicing. In the second embodiment, the ribs 132B are formed on the horizontal beams at positions that are closer to the horizontal-rotation axis AXH than the turnaround parts. This configuration makes it possible to reduce the variation in frequency characteristics in relation to the tilting direction of the bellows and prevent the bellows from being damaged during dicing.

Third Embodiment

Figure 11:
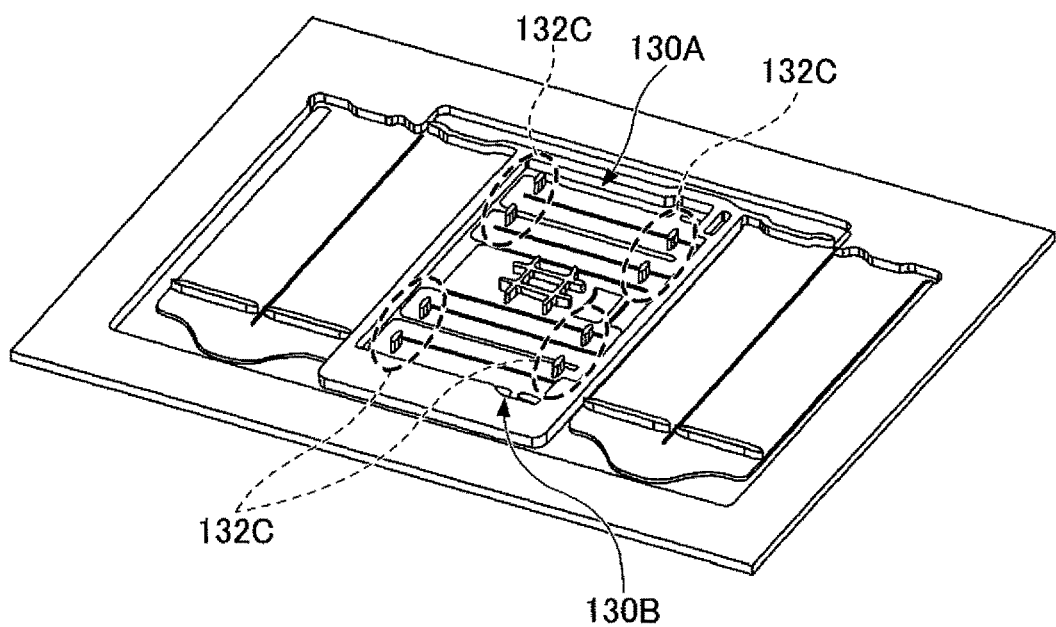
FIG. 11 is a bottom perspective view of an optical scanner of an optical scanning device according to a third embodiment.

FIG. 11 is a bottom perspective view of an optical scanner 100D of an optical scanning device according to a third embodiment. In the optical scanner 100D, the horizontal beams constituting the horizontal driving beams 130A and 130B includes a first-type beam and a second-type beam disposed adjacent to the first-type beam. A rib 132C is formed on the first-type beam at a position near an end of the first-type beam on a first side of the horizontal-rotation axis AXH, and another rib 132C is formed on the second-type beam at a position near an end of the second-type beam on a second side of the horizontal-rotation axis AXH that is opposite the first side. In the configuration of FIG. 11, the first-type beam and the second-type beam are arranged alternately.

For example, in each of the horizontal driving beams 130A and 130B, the first and third horizontal beams counted from the outer side may be the first-type beams, and the second and fourth horizontal beams may be the second-type beams. Alternatively, the second and fourth horizontal beams may be the first-type beams, and the first and third horizontal beams may be the second-type beams. Also, the first and fourth horizontal beams may be the first-type beams, and the second and third horizontal beams may be the second-type beams. In this case, the ribs 132C on the second and third horizontal beams need to be formed on the turnaround part connecting the second and third horizontal beams to each other. Further, the second and third horizontal beams may be the first-type beams, and the first and fourth horizontal beams may be the second-type beams. In this case, the ribs 132C on the second and third horizontal beams need to be formed on the turnaround part connecting the second and third horizontal beams to each other. As still another example, the horizontal beams constituting the horizontal driving beams 130A and 130B may include, in addition to the first-type beams and the second-type beams, a third-type beam on which no rib is formed.

In the optical scanning device of the third embodiment described above, the ribs 132C are formed on the second surfaces (lower surfaces) of the horizontal beams constituting the horizontal driving beams 130A and 130B. When a wafer including multiple MEMS structures is fixed to a dicing tape and diced to manufacture separate MEMS structures each of which is used as an actuator of the optical scanning device, the ribs 132C attached to the dicing tape can prevent the horizontal driving beams 130A and 130B from being excessively vibrated and damaged by a water flow and vibration generated during the dicing. In the third embodiment, the ribs 132C are formed on the horizontal beams at positions that are closer to the horizontal-rotation axis AXH than the turnaround parts. This configuration makes it possible to reduce the variation in frequency characteristics in relation to the tilting direction of the bellows and prevent the bellows from being damaged during dicing.

<Alignment Marks>

Figure 12:
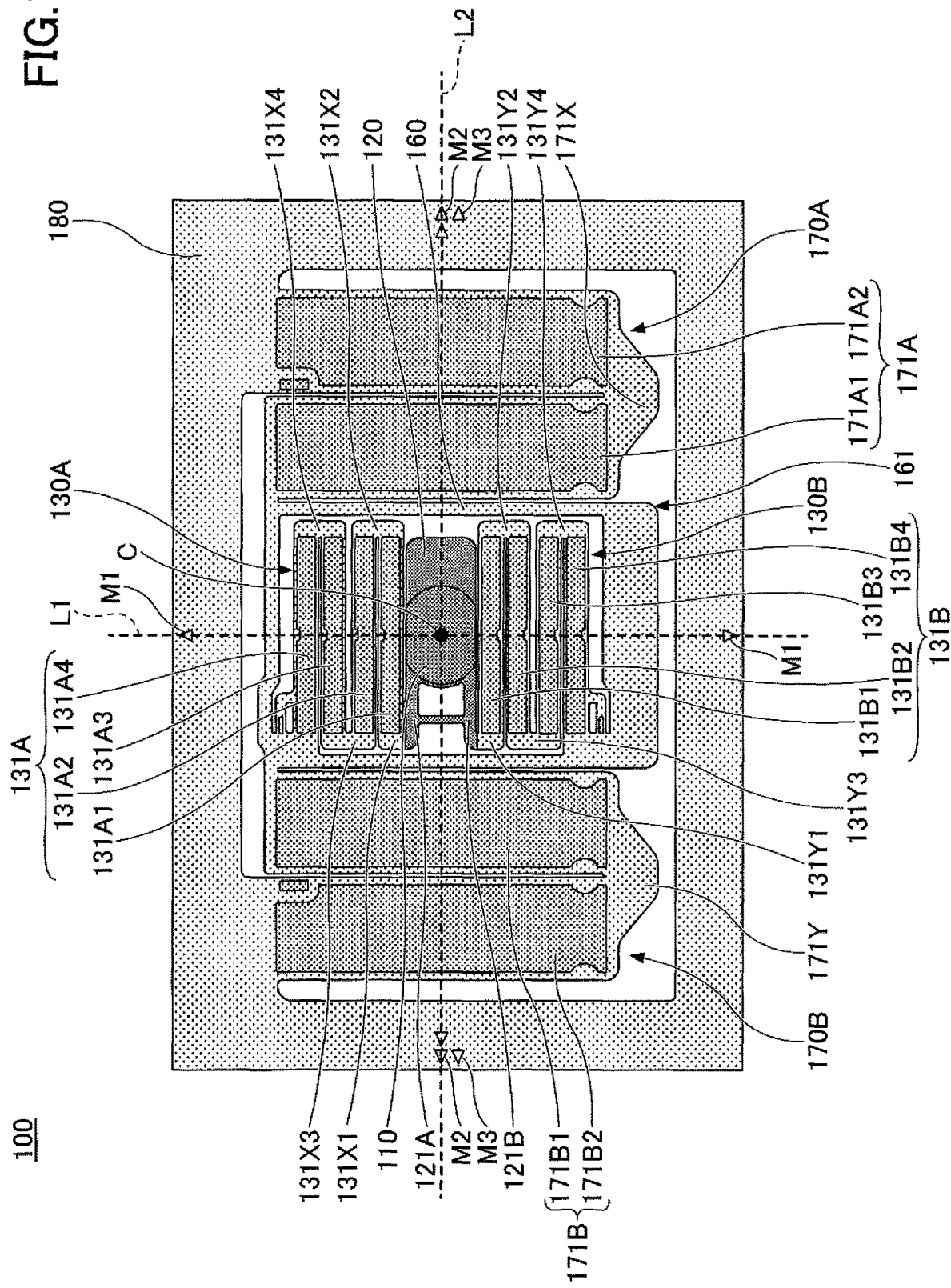
FIG. 12 is a drawing used to describe alignment marks.

Next, alignment marks formed on the fixed frame 180 of the optical scanner 100 illustrated in FIGS. 1 and 2 are described with reference to FIG. 12.

First alignment marks M1 and second alignment marks M2 are formed on a surface of the fixed frame 180. A pair of first alignment marks M1 are formed to face each other in the vertical direction across the mirror 110. A pair of second alignment marks M2 are formed to face each other in the horizontal direction across the mirror 110.

A first straight line L1 connecting the first alignment marks M1 and a second straight line L2 connecting the second alignment marks M2 intersect with each other at a center C of the mirror 110. Thus, the first alignment marks M1 and the second alignment marks M2 function as marks indicating the center C of the mirror 110.

The center C of the mirror 110 is positioned in the center of the rectangular fixed frame 180 in the horizontal direction, but is shifted from the center of the fixed frame 180 in the vertical direction. A pair of third alignment marks M3 indicate the center of the fixed frame 180 in the vertical direction.

The center C of the mirror 110 is shifted from the center of the fixed frame 180 in the vertical direction because one side of the movable frame 160 in the vertical direction is made wider than the other side so that one side of the mirror support structure 161 becomes heavier than the other side and the weight balance of the mirror 110 and the mirror support structure 161 is optimized. Here, the mirror support structure 161 refers to a portion including the mirror support 120, the coupling beams 121A and 121B, the horizontal driving beams 130A and 130B, and the movable frame 160. The weight balance of the mirror 110 and the mirror support structure 161 is optimized to prevent the occurrence of ringing during vertical driving.

Each of the first alignment marks M1 and the third alignment marks M3 is implemented by one triangular shape. Each of the second alignment marks M2 is implemented by two triangular shapes arranged in the horizontal direction so as to be distinguishable from the third alignment marks M3 disposed close to the second alignment marks M2. The shape of the alignment marks is not limited to a triangle, and any other shape may be used for the alignment marks.

Each of the alignment marks is preferably formed of a thin film of a high reflectance metal such as gold or silver so as to be easily identifiable by human eyes. Also, the alignment marks may be formed together with the mirror 110, wires, and electrodes in the same step in a manufacturing process of a MEMS structure implementing the actuator of the optical scanning device. That is, a special step for forming the alignment marks is not necessary.

A protective film or a high-reflection coating may be formed on the alignment marks as long as they are visually recognizable. As long as alignment marks indicating the center C of the mirror 110 are provided, the third alignment marks M3 may not necessarily formed.

Forming the alignment marks indicating the center C of the mirror 110 on the fixed frame 180 makes it easier to position the optical scanner 100 when placing the optical scanner 100 in a package or fixing the optical scanner 100 to a circuit board. This in turn makes it possible to easily and accurately align the center C of the mirror 110 with an optical system of a device using the optical scanner 100.

Accurately aligning the center C of the mirror 110 with an optical system makes it possible to accurately direct a laser beam to the center C of the mirror 110 and thereby reduce the occurrence of stray light caused by a laser beam entering areas other than the mirror 110.

Figure 13:
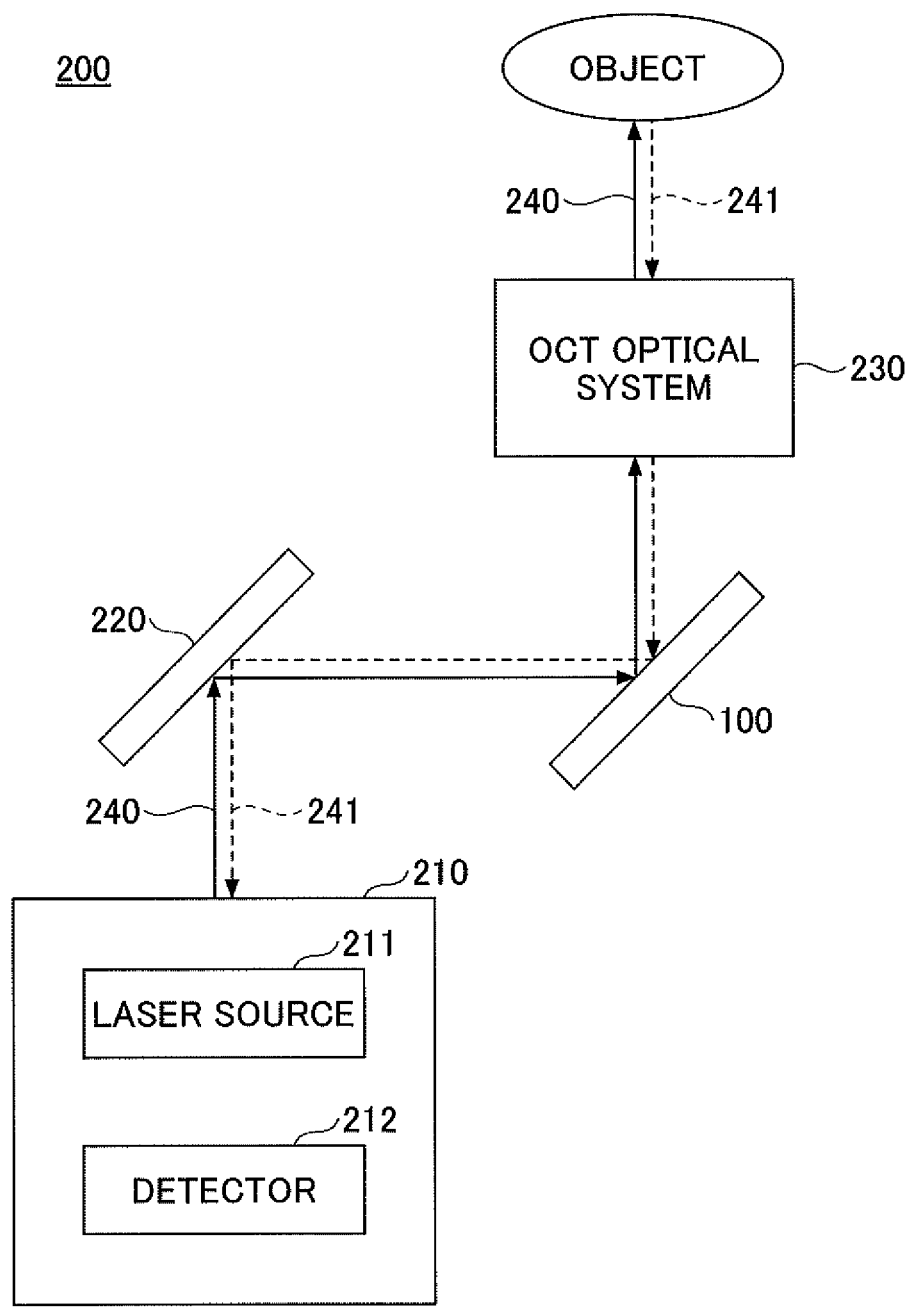
FIG. 13 is a drawing illustrating an example of an optical coherence tomography system including an optical scanner.

FIG. 13 is a drawing illustrating an example of an optical coherence tomography (OCT) system 200 including the optical scanner 100. As illustrated in FIG. 13, the OCT system 200 includes a main unit 210, a fixed mirror 220, the optical scanner 100, and an OCT optical system 230.

The main unit 210 includes a laser source 211 that emits a laser beam 240 and a detector 212 that detects a reflected laser beam 241. The reflected laser beam 241 is a reflection component that is generated when the laser beam 240 is reflected by an object.

The laser beam 240 emitted by the laser source 211 is reflected by the fixed mirror 220 and enters the optical scanner 100. The optical scanner 100 two-dimensionally deflects the entered laser beam 240 to scan the object with the laser beam 240 via the OCT optical system 230. The reflected laser beam 241 from the object passes through the same path as the laser beam 240 and enters the detector 212.

The optical scanner 100 is installed in the OCT system 200 with reference to a package or a circuit board to which the optical scanner 100 is attached. If the position of the attached optical scanner 100 is incorrect, the center C of the mirror 110 is misaligned with other components of the OCT system 200 and stray light is generated. Also, if the optical scanner 100 is tilted, it affects not only the path of the laser beam 240 but also the path of the reflected laser beam 241. Further, if the optical scanner 100 is shifted in the rotational direction, the rotation axis of the mirror 110 is tilted and as a result, the entire scanning area of the laser beam 240 is tilted.

Attaching the optical scanner 100 with reference to the alignment marks makes it possible to prevent the misalignment and the tilting of the optical scanner 100 and thereby makes it possible to reduce the occurrence of stray light, the misalignment of the path of the laser beam 240 and the reflected laser beam 241, and the tilting of the scanning area.

Preferably, reference marks are also provided on a device to which the optical scanner 100 is attached.

Actuators, optical scanning devices, and manufacturing methods of the actuators and the optical scanning devices according to embodiments of the present invention are described above. However, the present invention is not limited to the specifically disclosed embodiments, and variations and modifications may be made without departing from the scope of the present invention. For example, although an actuator is used for an optical scanning device including a mirror in the above embodiments, the actuator may also be used to drive an object other than a mirror, and the present invention may also be applied to a device that does not include a mirror. An optical scanning device according to an embodiment of the present invention is preferably used for an optical coherence tomography device of a funduscope. In an optical coherence tomography device of a funduscope, resonant driving is not necessary because one of the axes operates at high speed as in a projector, and it is desired that tilt angles can be freely set and adjusted to perform optical scanning. Accordingly, an optical scanner where nonresonant driving is used for both of two axes as in the above embodiments is preferably used for an optical coherence tomography device of a funduscope. An optical scanning device according to an embodiment of the present invention may also be used for a projection device.

What is claimed is:

1. An actuator, comprising:
a frame;
a first driving beam connected to the frame and an object to be driven, and includes multiple first beams extending in a direction orthogonal to a first predetermined axis, ends of each adjacent pair of the first beams being connected to each other via one of first turnaround parts such that the first driving beam forms a zig-zag bellows structure as a whole;
first driving sources formed on first surfaces of the first beams;
ribs formed on second surfaces of the first beams, a height of the ribs being same as a height of the frame; and
a dicing tape to which the frame and the ribs are attached, wherein the first driving sources are configured to move the first driving beam and thereby rotate the object around the first predetermined axis,
wherein the frame and the ribs include a plurality of laminated layers,
wherein the first predetermined axis is a rotation axis of the object,
wherein the ribs formed on the second surfaces of the respective first beams are each located closer to the rotation axis than a corresponding first turnaround part among the first turnaround parts, and
wherein a surface of a given layer, of each of the frame and the ribs, among the plurality of laminated layers is attached to the dicing tape, and the surface of the given layer of each of the ribs has the same height as the surface of the given layer of the frame.

2. An optical scanning device, comprising:
the actuator as claimed in claim 1;
a mirror including a light reflection surface; and
a mirror support structure that is the object to be driven and supports the mirror.

3. The optical scanning device as claimed in claim 2, wherein marks indicating a center of the mirror are formed on the frame.

4. The actuator as claimed in claim 1, wherein each of the ribs has a width in a longitudinal direction of the first beams and a length in a lateral direction of the first beams, and the width is shorter than the length.

5. The actuator as claimed in claim 1, wherein
each of the first beams has a width W1 in a direction of the first predetermined axis;
each of the ribs has a width W2 in a direction that is orthogonal to the first predetermined axis; and
the width W2 is less than or equal to 50% of the width W1.

6. The actuator as claimed in claim 1, wherein
each of the first beams has a width W1 in a direction of the first predetermined axis;
each of the ribs has a length L in the direction of the first predetermined axis; and
the length L is greater than or equal to 30% of the width W1.

7. The actuator as claimed in claim 1, wherein the ribs are formed on all of the first beams.

8. The actuator as claimed in claim 1, wherein the ribs are formed on alternate ones of the first beams such that a first beam with a rib and a first beam without a rib are arranged alternately and adjacent to each other.

9. The actuator as claimed in claim 1, wherein the ribs are formed on the first predetermined axis.

10. The actuator as claimed in claim 1, wherein
the first beams include a first-type beam and a second-type beam disposed adjacent to the first-type beam;
one of the ribs is formed on the first-type beam at a position near an end of the first-type beam on a first side of the first predetermined axis; and
another one of the ribs is formed on the second-type beam at a position near an end of the second-type beam on a second side of the first predetermined axis that is opposite the first side.

11. The actuator as claimed in claim 1, further comprising:
a second driving beam that is connected to the movable frame and includes multiple second beams extending in a direction orthogonal to a second predetermined axis, ends of each adjacent pair of the second beams being connected to each other via one of second turnaround parts such that the second driving beam forms a zig-zag bellows structure as a whole; and
second driving sources formed on first surfaces of the second beams, wherein
the first driving sources are configured to move the first driving beam and thereby rotate the object around the first predetermined axis; and
the second driving sources are configured to move the second driving beam and thereby rotate the object around the second predetermined axis.

12. A method of manufacturing an optical scanning device with the actuator of claim 1, the method comprising:
patterning a silicon-on-insulator substrate to form an integrated substrate including multiple actuators, each of the actuators including
the frame,
the first driving beam connected to the frame and to the object to be driven, the first driving including the multiple first beams extending in the direction orthogonal to the first predetermined axis, and the ends of each adjacent pair of the first beams being connected to each other via one of the first turnaround parts such that the first driving beam forms the zig-zag bellows structure as a whole,
the first driving sources formed on the first surfaces of the first beams, and
the ribs formed on the second surfaces of the first beams,
wherein the frame and the ribs include a plurality of laminated layers,
wherein the first predetermined axis is a rotation axis of the object, and
wherein the ribs formed on the respective second surfaces of the first beams are each located closer to the rotation axis than a corresponding first turnaround part among the first turnaround parts;
attaching the dicing tape to a side of the integrated substrate on which the ribs are formed, wherein a surface of a given layer, of each of the frame and the ribs, among the plurality of laminated layers is attached to the dicing tape, and the surface of the given layer of each of the ribs has the same height as the surface of the given layer of the frame;
dicing the integrated substrate to separate the actuators; and
removing the separated actuators from the dicing tape,
wherein the optical scanning device with the actuator includes
the actuator,
a mirror including a light reflection surface, and
a mirror support structure that is the object to be driven and supports the mirror.

13. The actuator as claimed in claim 1, wherein the plurality of laminated layers include (i) a plurality of laminated first layers that constitute the frame and (ii) a plurality of laminated second layers that constitute each of the ribs, the second layers being continuously connected to the respective first layers.

14. The actuator as claimed in claim 13, wherein the given layer of the frame is a bottom layer among the plurality of laminated first layers, and the given layer of each rib is a bottom layer among the plurality of laminated second layers, and
wherein a surface of the bottom layer of each rib has the same height as a surface of the bottom layer of the frame.

15. A method of manufacturing an actuator, the method comprising:
patterning a silicon-on-insulator substrate to form an integrated substrate including multiple actuators, each of the actuators including
a frame,
a driving beam that is connected to the frame and to an object to be driven, and includes multiple beams extending in a direction orthogonal to a predetermined axis, ends of each adjacent pair of the beams being connected to each other via one of turnaround parts such that the driving beam forms a zig-zag bellows structure as a whole,
driving sources formed on first surfaces of the beams, and
ribs formed on second surfaces of the beams, a height of the ribs being same as a height of the frame, and the driving sources being configured to move the driving beam and thereby rotate the object around the predetermined axis,
wherein the frame and the ribs include a plurality of laminated layers,
wherein the first predetermined axis is a rotation axis of the object, and
wherein the ribs formed on the respective second surfaces of the first beams are each located closer to the rotation axis than a corresponding first turnaround part among the first turnaround parts;
attaching a dicing tape to a side of the integrated substrate on which the ribs are formed, wherein a surface of a given layer, of each of the frame and the ribs, among the plurality of laminated layers is attached to the dicing tape, and the surface of the given layer of each of the ribs has the same height as the surface of the given layer of the frame;
dicing the integrated substrate to separate the actuators; and
removing the separated actuators from the dicing tape.

16. A method of manufacturing an optical scanning device, the method comprising:
the method as claimed in claim 15,
wherein the optical scanning device includes
the actuator,
a mirror including a light reflection surface, and
a mirror support structure that is the object to be driven and supports the mirror.

17. The optical scanning device as claimed in claim 16, wherein marks indicating a center of the mirror are formed on the frame.

18. The actuator as claimed in claim 15, wherein each of the ribs has a width in a longitudinal direction of the first beams and a length in a lateral direction of the first beams, and the width is shorter than the length.

19. The actuator as claimed in claim 15, wherein
each of the first beams has a width W1 in a direction of the first predetermined axis;
each of the ribs has a width W2 in a direction that is orthogonal to the first predetermined axis; and
the width W2 is less than or equal to 50% of the width W1.

20. The actuator as claimed in claim 15, wherein
each of the first beams has a width W1 in a direction of the first predetermined axis;
each of the ribs has a length L in the direction of the first predetermined axis; and
the length L is greater than or equal to 30% of the width W1.

21. The actuator as claimed in claim 15, wherein the ribs are formed on all of the first beams.

22. The actuator as claimed in claim 15, wherein the ribs are formed on alternate ones of the first beams such that a first beam with a rib and a first beam without a rib are arranged alternately and adjacent to each other.

23. The actuator as claimed in claim 15, wherein the ribs are formed on the first predetermined axis.

24. The actuator as claimed in claim 15, wherein
the first beams include a first-type beam and a second-type beam disposed adjacent to the first-type beam;
one of the ribs is formed on the first-type beam at a position near an end of the first-type beam on a first side of the first predetermined axis; and
another one of the ribs is formed on the second-type beam at a position near an end of the second-type beam on a second side of the first predetermined axis that is opposite the first side.

25. The actuator as claimed in claim 15, further comprising:
a second driving beam that is connected to the movable frame and includes multiple second beams extending in a direction orthogonal to a second predetermined axis, ends of each adjacent pair of the second beams being connected to each other via one of second turnaround parts such that the second driving beam forms a zig-zag bellows structure as a whole; and
second driving sources formed on first surfaces of the second beams, wherein
the first driving sources are configured to move the first driving beam and thereby rotate the object around the first predetermined axis; and
the second driving sources are configured to move the second driving beam and thereby rotate the object around the second predetermined axis.

26. A method of manufacturing an optical scanning device with the actuator of claim 15, the method comprising:
patterning a silicon-on-insulator substrate to form an integrated substrate including multiple actuators, each of the actuators including
the frame,
the first driving beam connected to the frame and to the object to be driven, the first driving including the multiple first beams extending in the direction orthogonal to the first predetermined axis, and the ends of each adjacent pair of the first beams being connected to each other via one of the first turnaround parts such that the first driving beam forms the zig-zag bellows structure as a whole,
the first driving sources formed on the first surfaces of the first beams, and
the ribs totaled on the second surfaces of the first beams,
wherein the frame and the ribs include a plurality of laminated layers,
wherein the first predetermined axis is a rotation axis of the object, and
wherein the ribs formed on the respective second surfaces of the first beams are each located closer to the rotation axis than a corresponding first turnaround part among the first turnaround parts;
attaching the dicing tape to a side of the integrated substrate on which the ribs are formed, wherein a surface of a given layer, of each of the frame and the ribs, among the plurality of laminated layers is attached to the dicing tape, and the surface of the given layer of each of the ribs has the same height as the surface of the given layer of the frame;
dicing the integrated substrate to separate the actuators; and
removing the separated actuators from the dicing tape,
wherein the optical scanning device with the actuator includes
the actuator,
a mirror including a light reflection surface, and
a mirror support structure that is the object to be driven and supports the mirror.

* * * * *